US010273146B2

(12) United States Patent
Guenther et al.

(10) Patent No.: US 10,273,146 B2
(45) Date of Patent: Apr. 30, 2019

(54) MICROMECHANICAL COMPONENT

(71) Applicant: Robert Bosch GmbH, Stuttgart (DE)

(72) Inventors: Sebastian Guenther, Tuebingen (DE); Tobias Sebastian Frey, Reutlingen (DE)

(73) Assignee: ROBERT BOSCH GMBH, Stuttgart (DE)

(*) Notice: Subject to any disclaimer, the term of this patent is extended or adjusted under 35 U.S.C. 154(b) by 37 days.

(21) Appl. No.: 15/711,888

(22) Filed: Sep. 21, 2017

(65) Prior Publication Data

US 2018/0093883 A1 Apr. 5, 2018

(30) Foreign Application Priority Data

Sep. 30, 2016 (DE) .................. 10 2016 219 106

(51) Int. Cl.
*B81B 7/00* (2006.01)
*G01C 19/56* (2012.01)
*G01P 15/00* (2006.01)
*G01P 15/08* (2006.01)

(52) U.S. Cl.
CPC ........... *B81B 7/0038* (2013.01); *G01C 19/56* (2013.01); *G01P 15/0802* (2013.01); *B81B 2201/025* (2013.01); *B81B 2201/0235* (2013.01); *G01P 15/006* (2013.01); *G01P 2015/088* (2013.01)

(58) Field of Classification Search
None
See application file for complete search history.

(56) References Cited

U.S. PATENT DOCUMENTS

2015/0353346 A1* 12/2015 Heuck ................ B81B 7/02
257/415

* cited by examiner

*Primary Examiner* — Thien F Tran
(74) *Attorney, Agent, or Firm* — Norton Rose Fulbright US LLP; Gerard Messina

(57) ABSTRACT

A micromechanical component is provided, the micromechanical component enclosing a cavity, the micromechanical component including a sensor element situated in the cavity, and the micromechanical component including a getter situated in the cavity. The micromechanical component includes a structure, situated between the sensor element and the getter, which is designed in such a way that a particle that is desorbed by the getter is sorbed onto and/or into an area of the micromechanical component that is spaced apart from the sensor element.

10 Claims, 3 Drawing Sheets

MICROMECHANICAL COMPONENT

CROSS REFERENCE

The present application claims the benefit under 35 U.S.C. § 119 of German Patent Application No. DE 102016219106.3 filed on Sep. 30, 2016, which is expressly incorporated herein by reference in its entirety.

FIELD

The present invention is directed to a micromechanical component.

BACKGROUND INFORMATION

Conventional MEMS rotation rate sensors require a high mechanical quality of the MEMS element. The quality of the MEMS element is determined essentially by the internal pressure in a MEMS cavity of the MEMS rotation rate sensor. Due to the friction between residual gas and the mechanical oscillating structure of the MEMS rotation rate sensor, energy is continuously withdrawn from the system, which limits the maximum quality in the mechanical system and the maximum quality of the MEMS element.

To set a low internal pressure and a high quality, the sensor wafer and the cap wafer are bonded in a chamber having the desired internal pressure. For example, residual gas and outgassing from the surface facing the cavity limit the achievable minimum internal pressures in the cavity.

The internal pressure may be further reduced and held essentially constant over the service life of the micromechanical component by use of a getter in the cavity.

SUMMARY

An object of the present invention is to provide a micromechanical component which has a quality that is settable in a targeted manner with protection for the sensor element, and in an easy and cost-effective manner.

The object may be achieved in accordance with the present invention. In an example embodiment, the micromechanical component includes a structure, situated between the sensor element and the getter, which is designed in such a way that a particle that is desorbed by the getter is sorbed onto and/or into an area of the micromechanical component that is spaced apart from the sensor element.

As a result, with the aid of the structure, the particle desorbed by the getter is advantageously not sorbed onto and/or into the sensor element of the micromechanical component. It is thus advantageously possible that for reducing the internal pressure in the cavity, the particle may be provided in the cavity without the sensor element interacting with the particle. A getter that acts particularly effectively and efficiently is thus made possible which binds residual gas molecules in the cavity without adversely affecting the properties of the sensor element. A micromechanical component is thus provided which has a quality that is settable in a targeted manner with protection for the sensor element, and in an easy and cost-effective manner.

In the context of the present invention, the term "micromechanical component" is understood to encompass micromechanical components as well as microelectromechanical components.

A pressure preferably prevails in the cavity, and a gas, preferably a gas mixture, having a chemical composition is enclosed. According to the present invention, "situated in the cavity" preferably means "in contact with the gas." According to the present invention, the cavity is preferably a hollow space.

Internal pressures, i.e., pressures in the cavity, of less than 1 mbar may be provided particularly preferably with the micromechanical component according to the present invention.

In addition, the micromechanical component preferably encloses a further cavity, a further pressure preferably prevailing in the further cavity, and a further gas having a further chemical composition being enclosed. The pressure is preferably less than the further pressure.

The sensor element preferably includes a rotation rate sensor element or a sensor core for measuring a rotation rate that is present at the micromechanical component. Alternatively or additionally, the sensor element preferably includes an acceleration sensor element or a sensor core for measuring an acceleration that is present at the micromechanical component.

Furthermore, the micromechanical component preferably includes a combination MEMS system. A rotation rate sensor element is particularly preferably situated in the cavity, and an acceleration sensor element is situated in the further cavity. A micromechanical component that includes two separate cavities, for example for a rotation rate sensor and for an acceleration sensor, is thus advantageously provided, thus ensuring a low pressure for the rotation rate sensor, and at the same time, a higher pressure for the acceleration sensor. The sensor wafer and the cap wafer are particularly preferably bonded at the target pressure of the acceleration sensor. The required internal pressure for the acceleration sensor is thus advantageously set. The getter or the getter material in the cap wafer or the getter situated in the cavity then preferably binds the residual gas in the cavity or rotation rate cavity.

The getter preferably includes, or preferred getter materials preferably are, aluminum (Al) and/or barium (Ba) and/or calcium (Ca) and/or cerium (Ce) and/or magnesium (Mg) and/or niobium (Nb) and/or phosphorus (P) and/or strontium (Sr) and/or tantalum (Ta) and/or terbium (Tb) and/or thorium (Th) and/or titanium (Ti) and/or zirconium (Zr). The getter is preferably a chemically reactive material that is used for maintaining a vacuum for a preferably long time. The getter is preferably in a solid state of aggregation and/or in a liquid state of aggregation and/or in a gaseous state of aggregation. For example, gas atoms or gas molecules of the gas form a direct chemical compound with the atoms or molecules of the getter at the surface of the getter. Alternatively or additionally, however, it is provided that the gas atoms or the gas molecules are held on the getter by sorption. In this way, the gas atoms or the gas molecules are "captured" in or on the surface of the getter material. A getter particle or a particle and/or multiple getter particles or particles is/are particularly preferably desorbed by the getter. In addition, the desorbed getter particle or the particle and/or the desorbed getter particle or the particles form(s) a chemical compound with one or multiple gas atoms or gas molecules of the gas. In addition, it is particularly preferably provided that the getter particle or the particle and/or the getter particles or the particles is/are sorbed onto and/or into the area of the micromechanical component that is spaced apart from the sensor element.

According to the present invention, a particle is preferably understood to mean an atom or an aggregation of atoms, for example a molecule or multiple molecules or an aggregation of multiple molecules. In the context of the present invention, the particle is in a gaseous, liquid, or solid state of aggregation or is part of a gaseous, liquid, or solid phase, and includes at least one phase boundary in its surroundings. The particle preferably includes a portion of the getter or getter material, or a portion of the getter or getter material in addition to an atom or atoms and/or a molecule or molecules of the gas. According to the present invention, a particle is understood in particular to mean a small body within the scale of the micromechanical component, i.e., a body having a maximum extension of $1/10$, preferably $1/100$, particularly preferably $1/1000$, very particularly preferably $1/10,000$, of a maximum extension of the micromechanical component.

In addition, the area that is spaced apart from the sensor element is preferably a surface of the micromechanical component facing the cavity, or a surface of the micromechanical component in contact with the gas, the surface and a further surface of the sensor element preferably being separated.

Advantageous embodiments and refinements of the present invention are described herein and are shown in the figures.

According to one preferred refinement, it is provided that the micromechanical component is designed in such a way that the particle is desorbed by the getter by introducing energy into an area of the micromechanical component that absorbs the energy. This advantageously makes it possible to deliver particles into the cavity in a particularly targeted manner, and thus set the internal pressure in the cavity in a particularly targeted manner.

Furthermore, the particle desorbs preferably by heating of the micromechanical component, particularly preferably by heating of the getter or the energy-absorbing area. The micromechanical component is preferably designed in such a way that the getter is heated by heat conduction from the energy-absorbing area to the getter. The desorption of the particle preferably includes evaporation of the getter or the particle.

According to one preferred refinement, it is provided that the micromechanical component includes a transparent area situated between the getter and the surroundings of the micromechanical component, a degree of transmission of the transparent area for a wavelength interval and a wall thickness interval of the transparent area being greater than a degree of transmission threshold value. As a result, a radiation source for introducing the energy may advantageously be determined in a targeted manner, as a function of the degree of transmission threshold value, and the particles may thus be delivered into the cavity in an even more targeted manner, and the internal pressure in the cavity may thus be set in an even more targeted manner.

According to one preferred refinement, it is provided that the structure is situated between the getter and a cap of the micromechanical component. A particle flow or an air flow is thus advantageously deflected from a direction toward the cap, thus increasing the amount of time between the desorption of the particle by the getter and contact between the particle and the cap. The particle thus has less energy upon contact between the particle and the cap, thus greatly increasing the likelihood of sorption of the particle onto and/or into the cap upon contact between the particle and the cap.

According to one preferred refinement, it is provided that a projection of the getter onto a main plane of extension of a substrate of the micromechanical component and a projection of the structure onto the main plane of extension overlap. This advantageously makes it possible for a particle flow or an air flow to be deflected from a direction perpendicular to the main plane of extension, and at the same time for a surface to be provided for sorption of the particle in the direction perpendicular to the main plane of extension.

According to one preferred refinement, it is provided that a projection of the getter onto a projection plane extending perpendicularly with respect to a main plane of extension of a substrate of the micromechanical component and a projection of the structure onto the projection plane overlap. This advantageously makes it possible for the getter as well as the sensor element to be situated on the substrate, and for a direct particle flow or an air flow in a direction in parallel to the main plane of extension to be avoided due to the structure.

A further subject matter of the present invention relates to a method for setting an internal pressure in a cavity of a micromechanical component, in particular a micromechanical component according to the present invention, the micromechanical component including a sensor element situated in the cavity, the micromechanical component including a getter situated in the cavity, the micromechanical component including a structure situated between the sensor element and the getter, the micromechanical component being provided in a first method step, a particle being desorbed by the getter and sorbed onto and/or into an area of the micromechanical component that is spaced apart from the sensor element in a second method step.

According to one preferred refinement, it is provided that the particle is desorbed by the getter in the second method step by introducing energy into an area of the micromechanical component that absorbs the energy.

According to one preferred refinement, it is provided that the energy is introduced into the absorbing area via a transparent area of the micromechanical component situated between the getter and the surroundings of the micromechanical component.

A further subject matter of the present invention relates to a system which includes a micromechanical component, in particular a micromechanical component according to the present invention, and an energy source for introducing energy into an area of the micromechanical component that absorbs the energy.

The stated advantages of the micromechanical component according to the present invention correspondingly also apply for the method according to the present invention and for the system according to the present invention.

DETAILED DESCRIPTION OF EXAMPLE EMBODIMENTS

Figure 1:
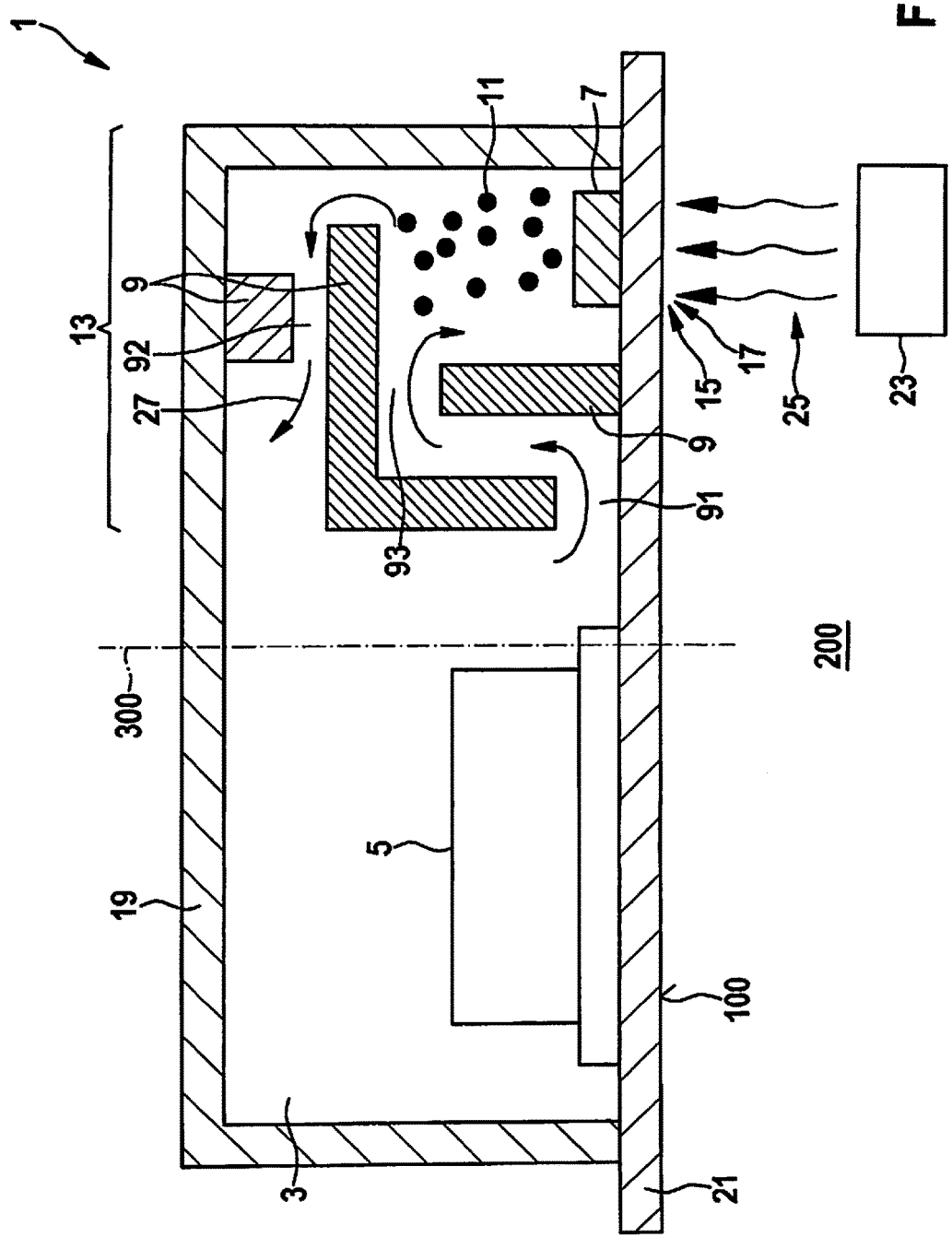
FIG. 1 shows a schematic illustration of a micromechanical component and a system according to one exemplary specific embodiment of the present invention.

Identical parts are provided with the same reference numerals in the various figures, and therefore are generally designated or mentioned only once in each case.

FIG. 1 shows a schematic illustration of a micromechanical component 1 and a system according to one exemplary specific embodiment of the present invention.

Micromechanical component 1, illustrated by way of example in FIG. 1, encloses a cavity 3, micromechanical component 1 including a sensor element 5 situated in cavity 3 and a getter 7 situated in cavity 3. In addition, micromechanical component 1 includes a structure 9 that is situated between sensor element 5 and getter 7. Structure 9 is designed in such a way that a particle 11 desorbed by getter 7 is sorbed onto and/or into an area 13 of micromechanical component 1 that is spaced apart from sensor element 5. The structure is preferably situated in the cavity.

As illustrated by way of example in FIG. 1, micromechanical component 1 includes a cap 19 and a substrate 21. In addition, getter 7 is preferably designed as a layer or as a getter layer (for example, titanium, aluminum, etc.). Getter 7 is particularly preferably situated on cap 19 of micromechanical component 1 and/or on substrate 21 of micromechanical component 1. Getter 7 is particularly preferably mounted inside the sensor core or in cavity 3, particularly preferably before cap 19 is bonded to substrate 21.

Micromechanical component 1 is preferably designed in such a way that particle 11 is desorbed by getter 7 by introducing energy into an area 15 of micromechanical component 1 that absorbs the energy. For example, micromechanical component 1 is designed in such a way that a reduction in the pressure, i.e., the internal pressure in a MEMS cavity, is made possible by evaporating a material or by evaporating getter 7, the evaporated material or evaporated getter 7 binding air molecules or gas molecules of the gas, resulting in lowering of the internal pressure, i.e., the pressure in cavity 3. As the result of a suitable structure within the chip, or structure 9 situated between sensor element 5 and getter 7, it is ensured that the evaporated getter material does not accumulate on the functional mechanical structures of the sensor or on sensor element 5.

Energy-absorbing area 15 is preferably situated in cap 19. Additionally or alternatively, energy-absorbing area 15 is preferably situated in substrate 21, as indicated by way of example in FIG. 1. Energy-absorbing area 15 is particularly preferably situated, at least partially, in getter 7.

In addition, micromechanical component 1 preferably includes a transparent area 17 that is situated between getter 7 and surroundings 200 of micromechanical component 1, a degree of transmission of transparent area 17 for a wavelength interval and a wall thickness interval of transparent area 17 being greater than a degree of transmission threshold value.

Transparent area 17 is preferably situated in cap 19. Additionally or alternatively, transparent area 17 is preferably situated in substrate 21, as indicated by way of example in FIG. 1.

Transparent area 17 is particularly preferably situated facing surroundings 200 of micromechanical component 1. Additionally or alternatively, energy-absorbing area 15 is particularly preferably situated facing cavity 3. In addition, energy-absorbing area 15 is particularly preferably situated facing getter 7 and/or contacting getter 7.

Furthermore, energy-absorbing area 15 and transparent area 17 are preferably situated adjacent to one another. A further degree of transmission of energy-absorbing area 15 for the wavelength interval and the wall thickness interval of energy-absorbing area 15 is particularly preferably less than the degree of transmission threshold value.

In addition, structure 9 is preferably situated between getter 7 and a cap 19 of micromechanical component 1. Additionally or alternatively, structure 9 is preferably situated between getter 7 and substrate 21. Moreover, structure 9 is preferably designed as part of cap 19. In other words, micromechanical component 1 is preferably designed in such a way that cap 19 includes at least a portion of structure 9. Additionally or alternatively, structure 9 is preferably designed as part of substrate 21. In other words, micromechanical component 1 is preferably designed in such a way that substrate 21 includes at least a portion of structure 9.

A projection of getter 7 onto a main plane of extension 100 of a substrate 21 of micromechanical component 1 and a projection of structure 9 onto main plane of extension 100 preferably overlap. In addition, a projection of getter 7 onto a projection plane 300 extending perpendicularly with respect to main plane of extension 100 and a projection of structure 9 onto projection plane 300 preferably overlap.

Furthermore, FIG. 1 shows by way of example a system according to the present invention, the system including a micromechanical component 1, in particular a micromechanical component 1 according to the present invention, and an energy source 23 for introducing energy into an energy-absorbing area 15 of micromechanical component 1. Energy source 23 preferably includes a radiation source or an optical energy source, particularly preferably a laser, very particularly preferably a $CO_2$ laser. For example, the required energy input for evaporating the getter material is introduced with the aid of a suitable radiation source, preferably with the aid of a laser ($CO_2$ laser, for example). Alternatively or additionally, energy source 23 includes a contact plate, in particular a metallic contact plate, the contact plate preferably being designed in such a way that energy is introducible from the contact plate into energy-absorbing area 15 by heat conduction. Alternatively or additionally, energy source 23 includes a convection device, the convection device being designed in such a way that a fluid flows from the convection device onto energy-absorbing area 15 in order to introduce energy into energy-absorbing area 15. Alternatively or additionally, energy source 23 includes a heat radiation device, the heat radiation device being designed in such a way that heat radiation from the heat radiation device is incident on energy-absorbing area 15 and is absorbed by energy-absorbing area 15 in order to introduce energy into energy-absorbing area 15.

Getter 7 or the getter material is preferably heated and evaporated by energy source 23 or a suitable radiation source, preferably a suitable laser source, and distributed in cavity 3 or in the MEMS sensor. In addition, getter 7 or the getter layer preferably absorbs the gas or the residual gas in the sensor and thus lowers the pressure, i.e., the internal pressure in cavity 3.

A suitable laser source is preferably used for which the wafer substrate or transparent area 17 has high transparency, so that the majority of the radiation energy may be used for evaporating the getter material, and the majority of the radiation energy may thus be absorbed into energy-absorbing area 15.

Structure 9 or a suitable structure 9 is preferably built around the getter material, or structure 9 is designed in such a way that structure 9 encompasses getter 7 at least partially, in particular along a direction in parallel to main plane of extension 100. In addition, structure 9 is designed in such a way that an air flow 27 or a gas flow 27 of the gas or a particle flow in cavity 3 may be channeled in such a way that the evaporating getter material or particle 11 does not accumulate on the functional structures of the mechanical components of the sensor or on sensor element 5. Air flow 27 or gas flow 27 of the gas is preferably directed past getter 7 or suitably channeled.

Energy source 23 or the laser is preferably applied from the rear side of substrate 21 or from main plane of extension 100. The residual absorption, i.e., the absorption of substrate 21 or substrate material with regard to energy radiation 25 or laser light 25, preferably results in substrate 21 being warmer compared to cap 19. The warming air or the warming gas thus preferably rises from substrate 21 and in the direction of cap 19, and cools on the wafer cap or cap 19. Structure 9 is preferably designed in such a way that the gaseous getter material particles or the particles follow this air flow 27 or gas flow 27, so that the gaseous getter material particles or the particles cool on the wafer cap or cap 19 and accumulate there. Thus, the gaseous getter material particles or the particles preferably do not accumulate on the functional mechanical structures or sensor element 5.

In addition, structure 9 is preferably situated around the getter material. Structure 9 preferably includes a first recess 91 or a first opening 91. First recess 91 is preferably situated between a center of mass of structure 9 and substrate 21. First recess 91 is particularly preferably encompassed by structure 9 and substrate 21 in a plane perpendicular to main plane of extension 100. In other words, first recess 91 is situated in the vicinity of the wafer substrate or of substrate 21.

Moreover, structure 9 preferably includes a further first recess 91' and/or a third first recess 91". Further first recess 91' and/or third first recess 91" is/are preferably situated between a center of mass of structure 9 and substrate 21 (see FIG. 2). Further first recess 91' and/or third first recess 91" is/are particularly preferably encompassed by structure 9 and substrate 21 in a plane perpendicular to main plane of extension 100.

In addition, structure 9 preferably includes a second recess 92 or an outlet opening 92. Second recess 92 is preferably situated between a center of mass of structure 9 and cap 19. Second recess 92 is particularly preferably encompassed by structure 9 in a plane perpendicular to main plane of extension 100. Alternatively, second recess 92 is encompassed by structure 9 and by cap 19 in a plane perpendicular to main plane of extension 100. Structure 9 preferably includes projections 29, 29', 29", 29''' that protrude into cavity 3 in the direction of main plane of extension 100 and that are spaced apart from one another in parallel to main plane of extension 100. In addition, second recess 92 is preferably situated in the vicinity of cap 19.

Furthermore, structure 9 preferably includes a third recess 93. Third recess 93 is preferably situated between sensor element 5 and getter 7, in parallel to main plane of extension 100. Structure 9 is particularly preferably designed in such a way that third recess 93 is encompassed by structure 9 in a plane perpendicular to main plane of extension 100.

In addition, first recess 91, second recess 92, and third recess 93 are situated in such a way that air flow 27 initially passes through first recess 91, then through third recess 93, and subsequently through second recess 92.

According to the present invention, warmer air or gas is preferably situated in the area of first recess 91 or in the area of energy-absorbing area 15 after or during the introduction of energy, preferably in second method step 102, the warm air or the warm gas rising from substrate 21 in the direction of cap 19 and exiting through second recess 92. A principle similar to that employed in a fireplace is preferably used.

In addition, structure 9 preferably has a maze-like design. Air flow 27 is preferably directed to getter 7 or getter material and directed away again from same, so that evaporating getter 7 or the evaporating getter material accumulates on the walls of structure 9 or of an auxiliary structure and/or on cap 19, and not on sensor element 5 or a sensor part.

According to the present invention, structure 9 preferably includes multiple recesses or holes, preferably of different sizes, for suitably directing air flow 27. According to the present invention, in particular different designs of structure 9 are provided around getter 7 or the getter material in such a way that no particle 11 or no getter 7 or no getter material accumulates on the mechanical structure or sensor element 5.

Figure 2:
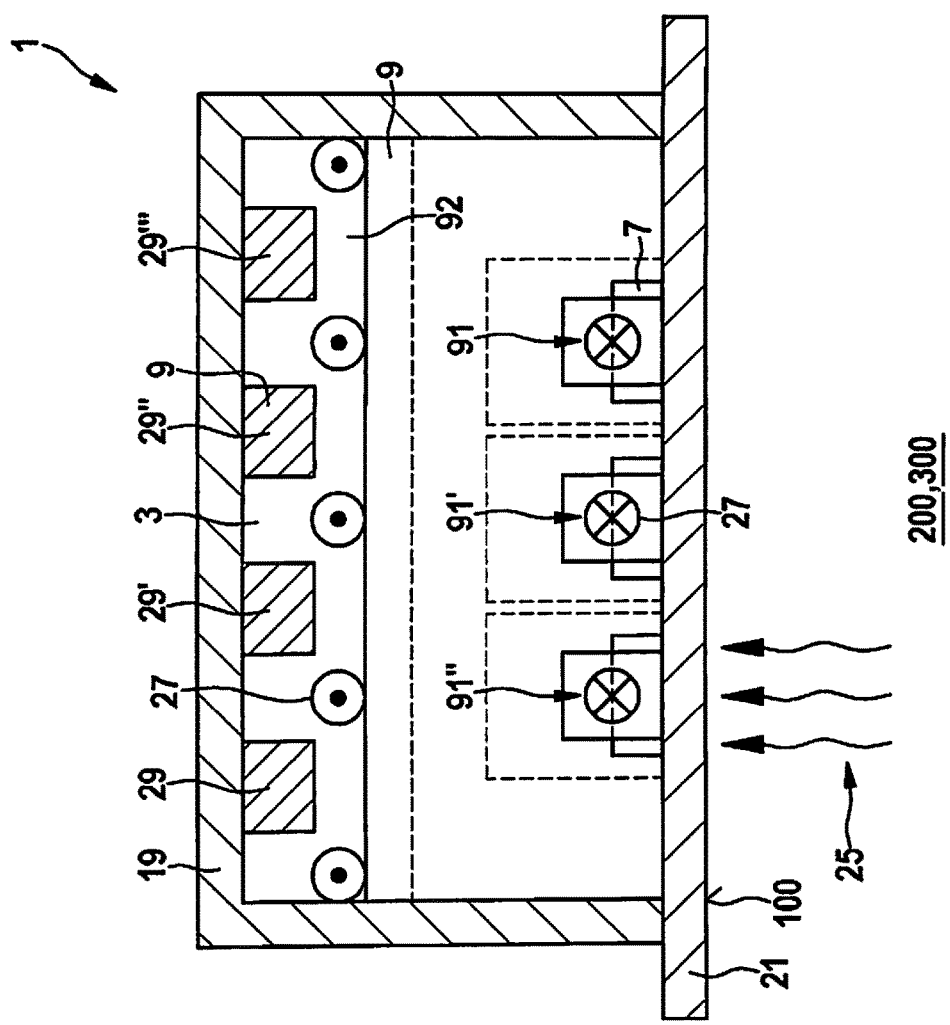
FIG. 2 shows a schematic illustration of a micromechanical component according to one exemplary specific embodiment of the present invention.

FIG. 2 shows a schematic illustration of a micromechanical component 1 according to one exemplary specific embodiment of the present invention. Micromechanical component 1 illustrated in FIG. 2 is essentially a side view in a sectional position along projection plane 300 in FIG. 1.

Figure 3:
FIG. 3 shows a schematic illustration of a degree of transmission as a function of a wavelength of a transparent area of a micromechanical component and a system according to one exemplary specific embodiment of the present invention.

FIG. 3 shows a schematic illustration of a degree of transmission 400 as a function of a wavelength 500 of a transparent area of a micromechanical component 1 and a system according to one exemplary specific embodiment of the present invention. Degree of transmission 400 is preferably a degree of transmission of a 5-mm thick, uncoated silicon window, the silicon window being situated within transparent area 17.

Figure 4:
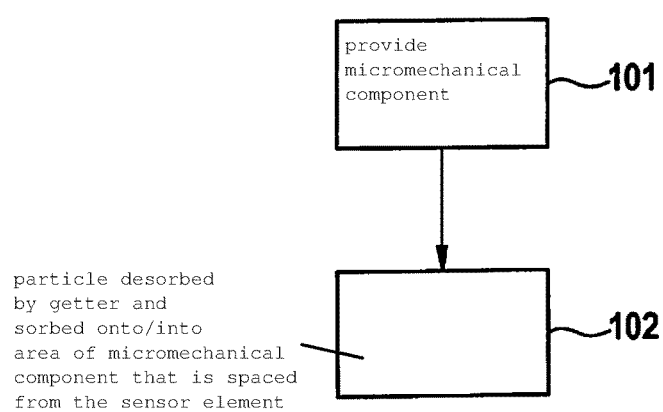
FIG. 4 shows a schematic illustration of a method according to one exemplary specific embodiment of the present invention.

FIG. 4 shows a schematic illustration of a method according to one exemplary specific embodiment of the present invention.

In the method according to the present invention, illustrated by way of example in FIG. 4, for setting an internal pressure in a cavity 3 of a micromechanical component 1, in particular a micromechanical component 1 according to the present invention, micromechanical component 1 is provided in a first method step 101 and a particle 11 is desorbed by getter 7 and sorbed onto and/or into an area 13 of micromechanical component 1 that is spaced apart from sensor element 5 in a second method step 102.

Particle 11 is preferably desorbed by getter 7 in second method step 102 by introducing energy into an area 15 of micromechanical component 1 that absorbs the energy.

Furthermore, the energy is preferably introduced into the absorbing area 15 via a transparent area 17 of micromechanical component 1 situated between getter 7 and surroundings 200 of micromechanical component 1.

In addition, the method according to the present invention is preferably carried out according to a wafer bonding process.

The method according to the present invention and micromechanical component 1 according to the present invention preferably make it possible to generate a vacuum having a defined residual pressure in a MEMS element.

Advantages of micromechanical component 1 according to the present invention, of the method according to the present invention, and of the system according to the present invention are in particular:

separate setting of different pressures for rotation rate sensors and acceleration sensors on a chip, more accurate setting of the internal pressure, and thus a reduction in quality variations in the sensor across the wafer, and a contactless method that requires no additional electrical contacts.

Structure 9 or the auxiliary structures is/are preferably mounted and/or structured using processes that are suitable in the inertial sensor system. Micromechanical component 1 according to the present invention is thus advantageously manufacturable using standard layer technology processes. In other words, structure 9 or the structures is/are integratable into standard process sequences.

What is claimed is:

1. A micromechanical component, the micromechanical component enclosing a cavity, the micromechanical component including a sensor element situated in the cavity, the micromechanical component including a getter situated in the cavity, wherein the micromechanical component includes a structure, situated between the sensor element and the getter, which is designed in such a way that a particle that is desorbed by the getter is sorbed on and/or in an area of the micromechanical component that is spaced apart from the sensor element.

2. The micromechanical component as recited in claim 1, wherein the micromechanical component is designed in such a way that the particle is desorbed by the getter by introducing energy into an area of the micromechanical component that absorbs the energy.

3. The micromechanical component as recited in claim 1, wherein the micromechanical component includes a transparent area situated between the getter and a surroundings of the micromechanical component, a degree of transmission of the transparent area for a wavelength interval and a wall thickness interval of the transparent area being greater than a degree of transmission threshold value.

4. The micromechanical component as recited in claim 1, wherein the structure is situated between the getter and a cap of the micromechanical component.

5. The micromechanical component as recited in claim 1, wherein a projection of the getter onto a main plane of extension of a substrate of the micromechanical component and a projection of the structure onto the main plane of extension overlap.

6. The micromechanical component as recited in claim 1, wherein a projection of the getter onto a projection plane extending perpendicularly with respect to a main plane of extension of a substrate of the micromechanical component and a projection of the structure onto the projection plane overlap.

7. A method for setting an internal pressure in a cavity of a micromechanical component, the method comprising:
providing the micromechanical component, the micromechanical component including a sensor element situated in the cavity, the micromechanical component including a getter situated in the cavity, the micromechanical component including a structure situated between the sensor element and the getter;
desorbing, by the getter, a particle; and
sorbing the particle on and/or in an area of the micromechanical component that is spaced apart from the sensor element.

8. The method as recited in claim 7, wherein the particle is desorbed by the getter by introducing energy into an area of the micromechanical component that absorbs the energy.

9. The method as recited in claim 7, wherein the energy is introduced into the absorbing area via a transparent area of the micromechanical component situated between the getter and a surroundings of the micromechanical component.

10. A system, comprising:
a micromechanical component, the micromechanical component enclosing a cavity, the micromechanical component including a sensor element situated in the cavity, the micromechanical component including a getter situated in the cavity, wherein the micromechanical component includes a structure, situated between the sensor element and the getter, which is designed in such a way that a particle that is desorbed by the getter is sorbed on and/or in an area of the micromechanical component that is spaced apart from the sensor element; and
an energy source for introducing energy into an area of the micromechanical component that absorbs the energy.

* * * * *